(12) United States Patent
Liao (10) Patent No.: US 8,289,707 B2
(45) Date of Patent: Oct. 16, 2012

(54) REMOVABLE ASSEMBLY AND COMMUNICATION DEVICE EMPLOYING SAME

(75) Inventor: Feng-Liang Liao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 284 days.

(21) Appl. No.: 12/821,138

(22) Filed: Jun. 23, 2010

(65) Prior Publication Data

US 2011/0182006 A1 Jul. 28, 2011

(30) Foreign Application Priority Data

Jan. 25, 2010 (CN) .......................... 2010 1 0300665

(51) Int. Cl.
*G06F 1/16* (2006.01)
*H05K 5/00* (2006.01)
*H05K 7/00* (2006.01)

(52) U.S. Cl. ................... 361/679.58; 361/726
(58) Field of Classification Search ............. 361/679.02, 361/679.4–679.44, 679.58, 724–727
See application file for complete search history.

(56) References Cited

U.S. PATENT DOCUMENTS

| | | | | |
|---|---|---|---|---|
| 5,003,431 A * | 3/1991 | Imsdahl | ........................ | 361/798 |
| 5,277,615 A * | 1/1994 | Hastings et al. | .............. | 439/377 |
| 5,414,594 A * | 5/1995 | Hristake | ........................ | 361/755 |
| 6,025,989 A * | 2/2000 | Ayd et al. | ........................ | 361/695 |
| 6,137,684 A * | 10/2000 | Ayd et al. | ........................ | 361/727 |
| 6,354,164 B1 * | 3/2002 | Megason et al. | ................. | 74/109 |
| 6,454,355 B2 * | 9/2002 | Biletskiy | .................. | 297/378.12 |
| 6,490,153 B1 * | 12/2002 | Casebolt et al. | .......... | 361/679.33 |
| 6,790,068 B2 * | 9/2004 | Westphall et al. | ............ | 439/325 |
| 6,884,096 B2 * | 4/2005 | Centola et al. | ................. | 439/157 |
| 6,992,900 B1 * | 1/2006 | Suzue et al. | ................... | 361/801 |
| 7,027,309 B2 * | 4/2006 | Franz et al. | .................... | 361/798 |
| 7,264,490 B1 * | 9/2007 | Reznikov | ....................... | 439/152 |
| 7,295,447 B2 * | 11/2007 | Strmiska et al. | .............. | 361/798 |
| 7,480,963 B2 * | 1/2009 | Liang | ............................... | 16/422 |
| 7,532,486 B2 * | 5/2009 | Strmiska et al. | .............. | 361/798 |
| 2002/0104396 A1 * | 8/2002 | Megason et al. | ................. | 74/109 |
| 2005/0146855 A1 * | 7/2005 | Brehm et al. | .................. | 361/724 |
| 2007/0206351 A1 * | 9/2007 | Szelong et al. | ................ | 361/685 |
| 2008/0013272 A1 * | 1/2008 | Bailey et al. | .................. | 361/685 |
| 2008/0204994 A1 * | 8/2008 | Wang | ............................. | 361/685 |

* cited by examiner

*Primary Examiner* — Adrian S Wilson
(74) *Attorney, Agent, or Firm* — Altis Law Group, Inc.

(57) ABSTRACT

A removable assembly adapted to be inserted into a shell defining a pair of grooves includes a support tray, a panel perpendicular to the support tray and defining a pair of gaps and a pair of handle assemblies. Each of the handle assemblies includes a trigger, a shiftable plate and a spring. The trigger pivots to the support tray. The shiftable plate engages with the trigger to rotate together with the trigger or disengage from the trigger under an external force to keep the support tray immovable during rotating the trigger. The shiftable plate includes an urging portion used to urge an outer surface of the shell to move the support tray out from the shell. The spring is urged between the panel and the shiftable plate to ensure the shiftable plate engage with the trigger.

16 Claims, 7 Drawing Sheets

REMOVABLE ASSEMBLY AND COMMUNICATION DEVICE EMPLOYING SAME

BACKGROUND

1. Technical Field

The present disclosure generally relates to communication devices, and more particularly to a removable assembly adapted to be inserted into or removed from a communication device.

2. Description of Related Art

Communication devices, such as routers and switches, often utilize removable assemblies to communicate with other electronic devices. Removable assemblies generally include an interface panel with a plurality of input/output (I/O) ports used to receive connectors, such as RJ45 connectors. One or two handles are usually disposed on the front panel of the removable assembly. Generally, the handles are set close to at least one of the I/O ports and occupy the space around the I/O ports and so can be difficult to use when inserting or removing connectors from the removable assemblies.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
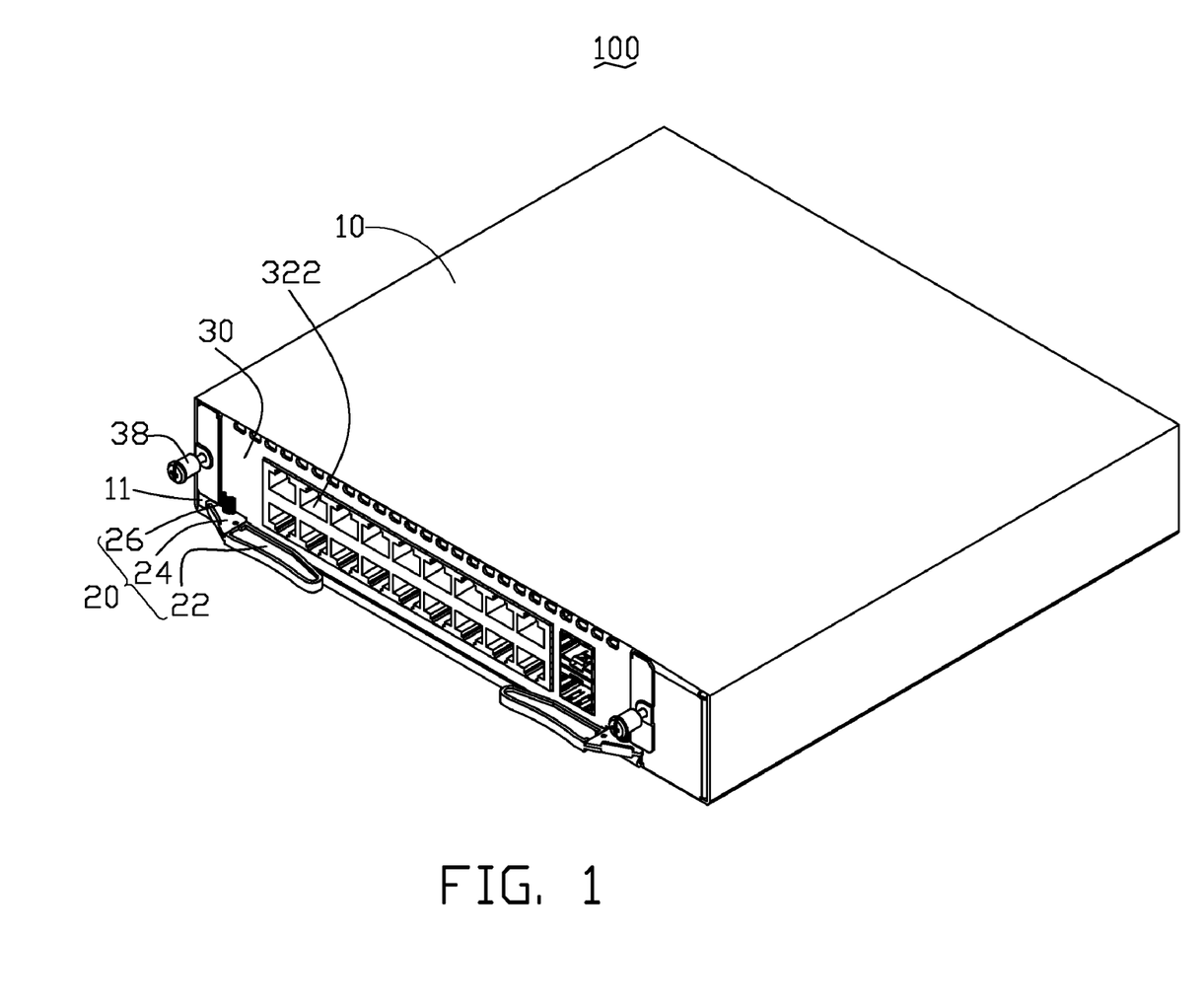
FIG. 1 is a perspective view of a communication device employing a removable assembly of an exemplary embodiment of the disclosure.
Figure 2:
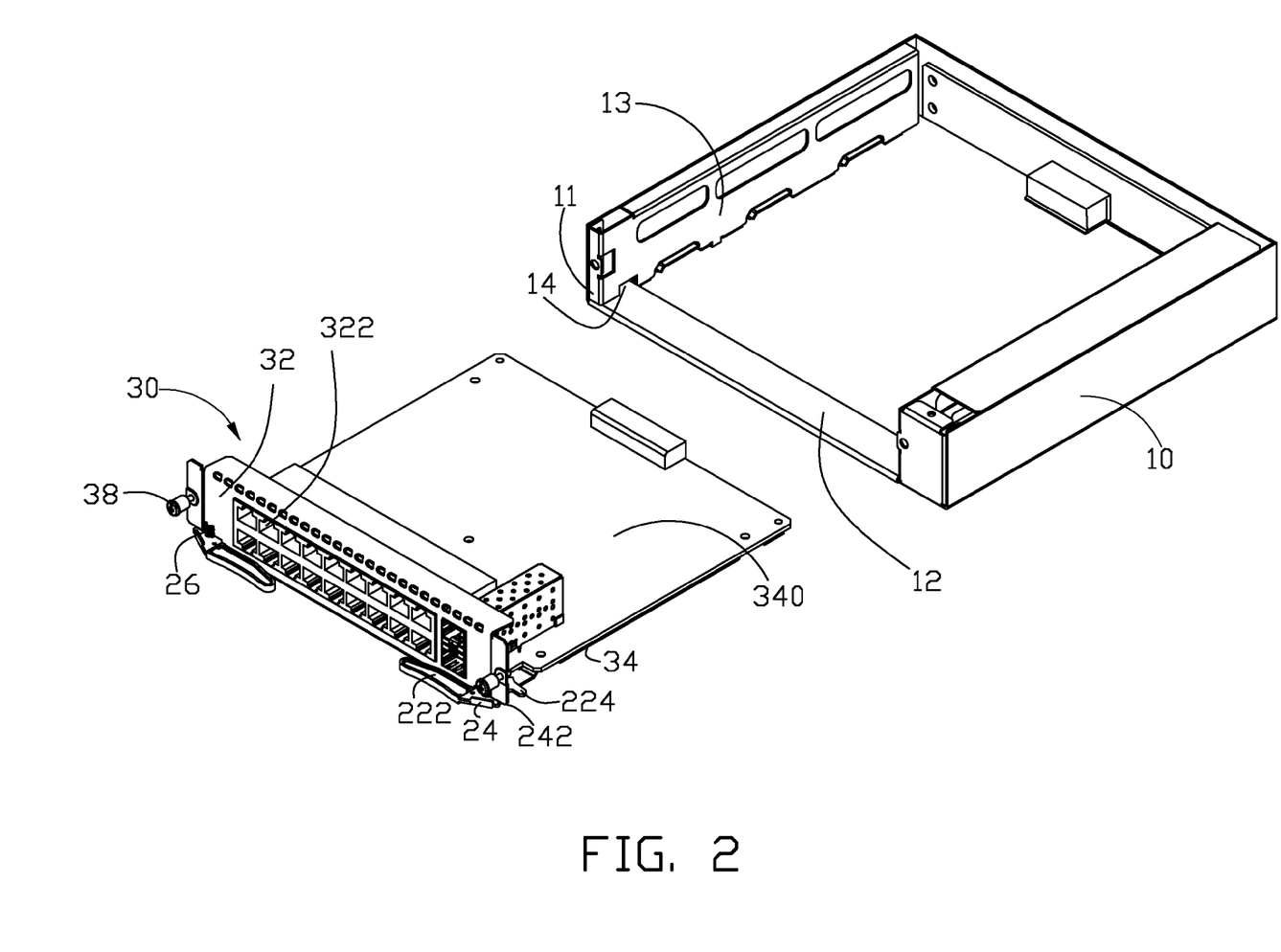
FIG. 2 is an exploded view of FIG. 1.

Referring to FIG. 1 and FIG. 2, a removable assembly 30 used in a communication device 100 comprises a panel 32, a support tray 34 and a pair of handle assemblies 20. The communication device 100 comprises a shell 10 defining a first opening 12 and a pair of grooves 14. The pair of grooves 14 are respectively defined in a pair of opposite inner walls 13 of the shell 10 and close to the first opening 12. The support tray 34 is used to contain a printed circuit board (PCB) 340. The panel 32 is perpendicular to the support tray 34.

Figure 3:
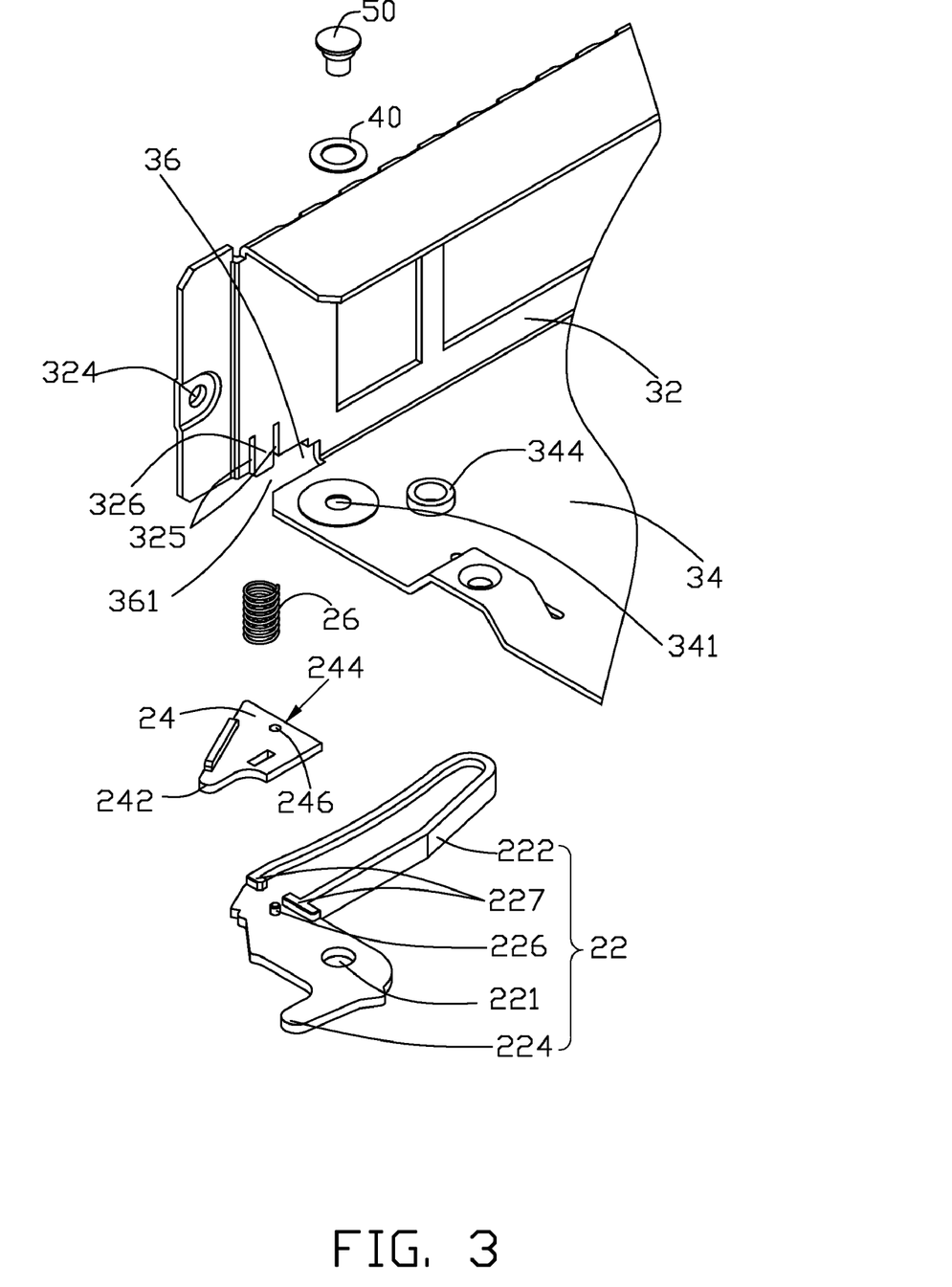
FIG. 3 is a partially exploded view of the removable assembly of FIG. 1.
Figure 4:
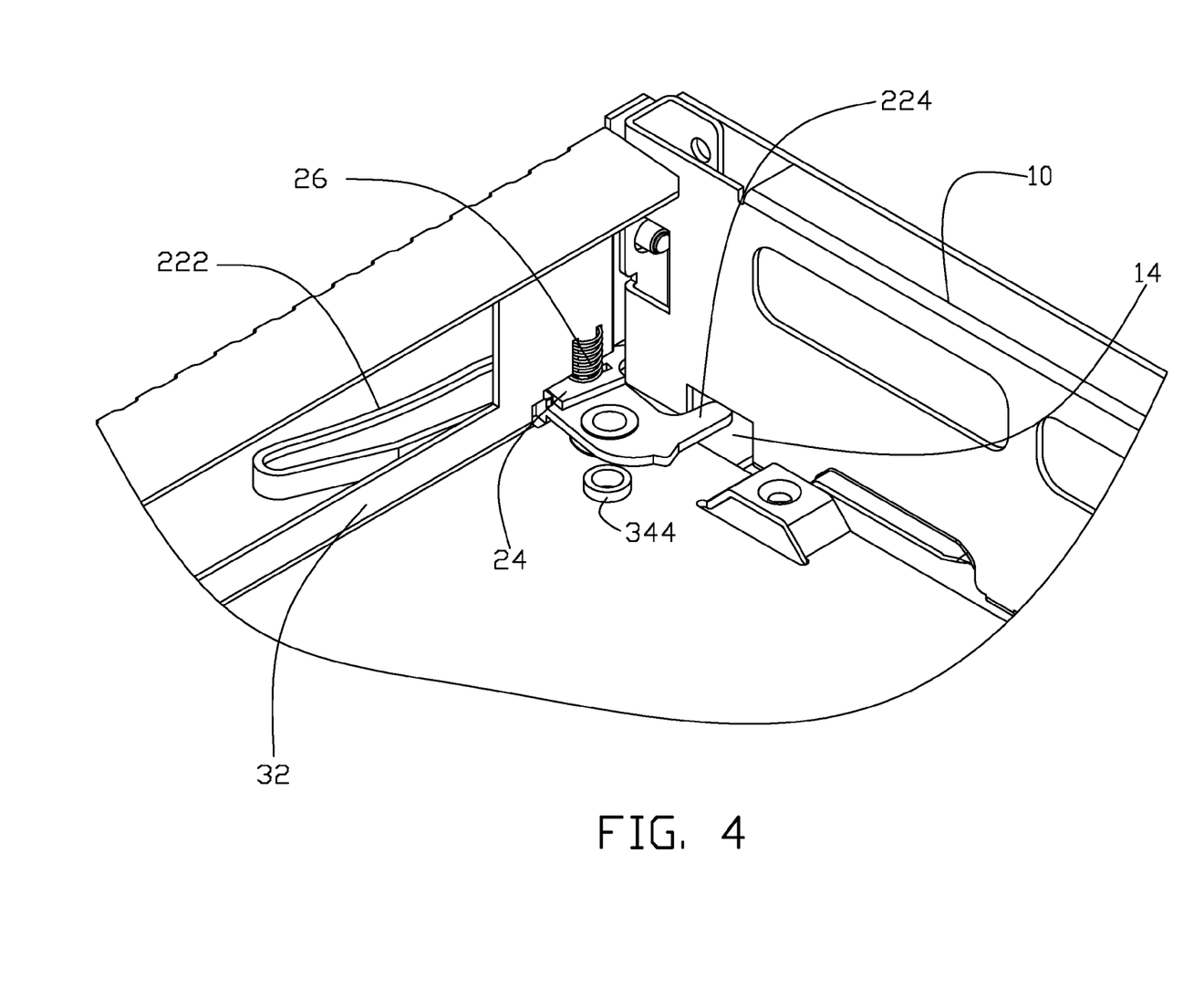
FIG. 4 is a partially assembled interior perspective view of the removable assembly used in the communication device of FIG. 1.
Figure 5:
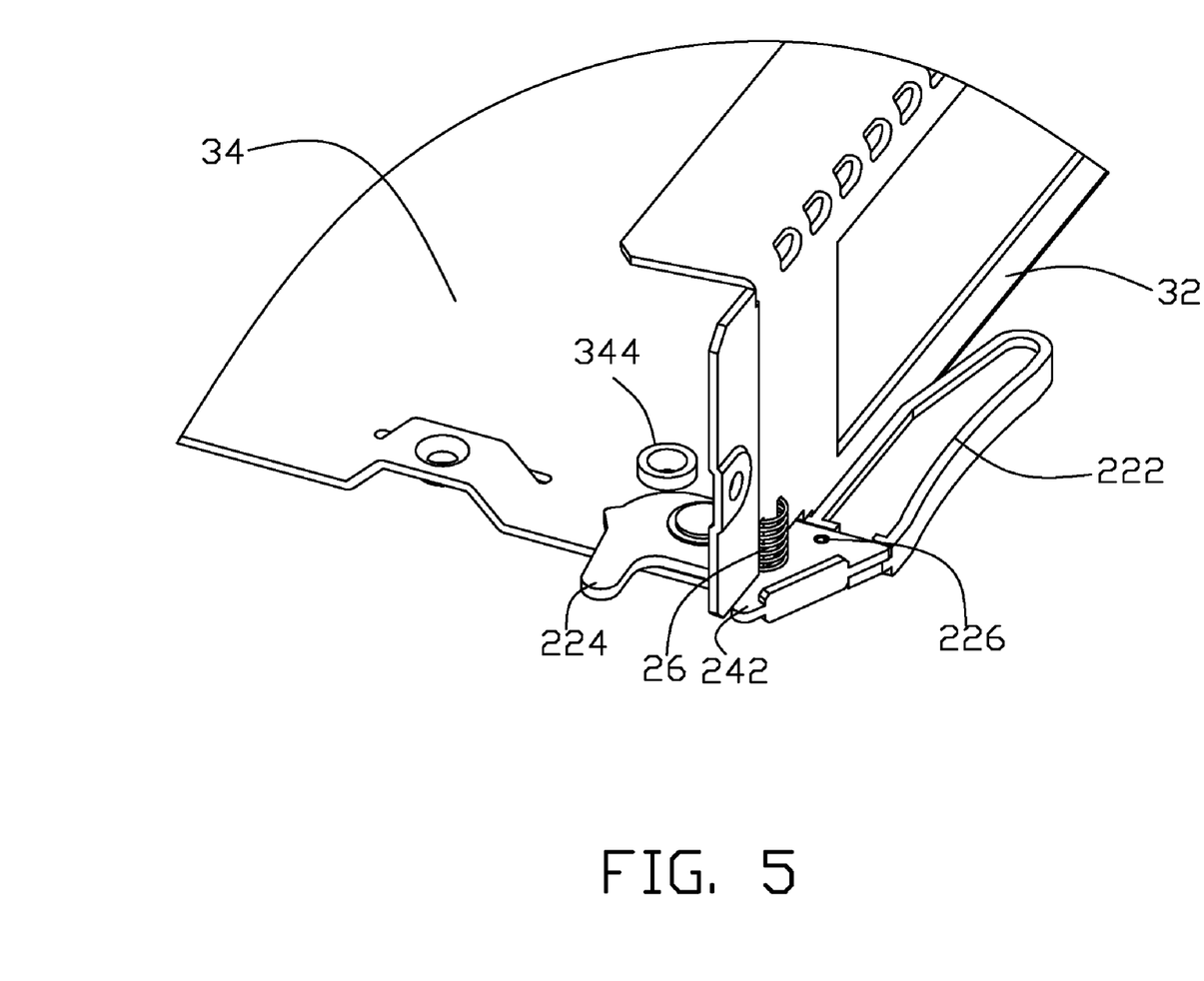
FIG. 5 is another partially assembled perspective view of the removable assembly of FIG. 1.
Figure 6:
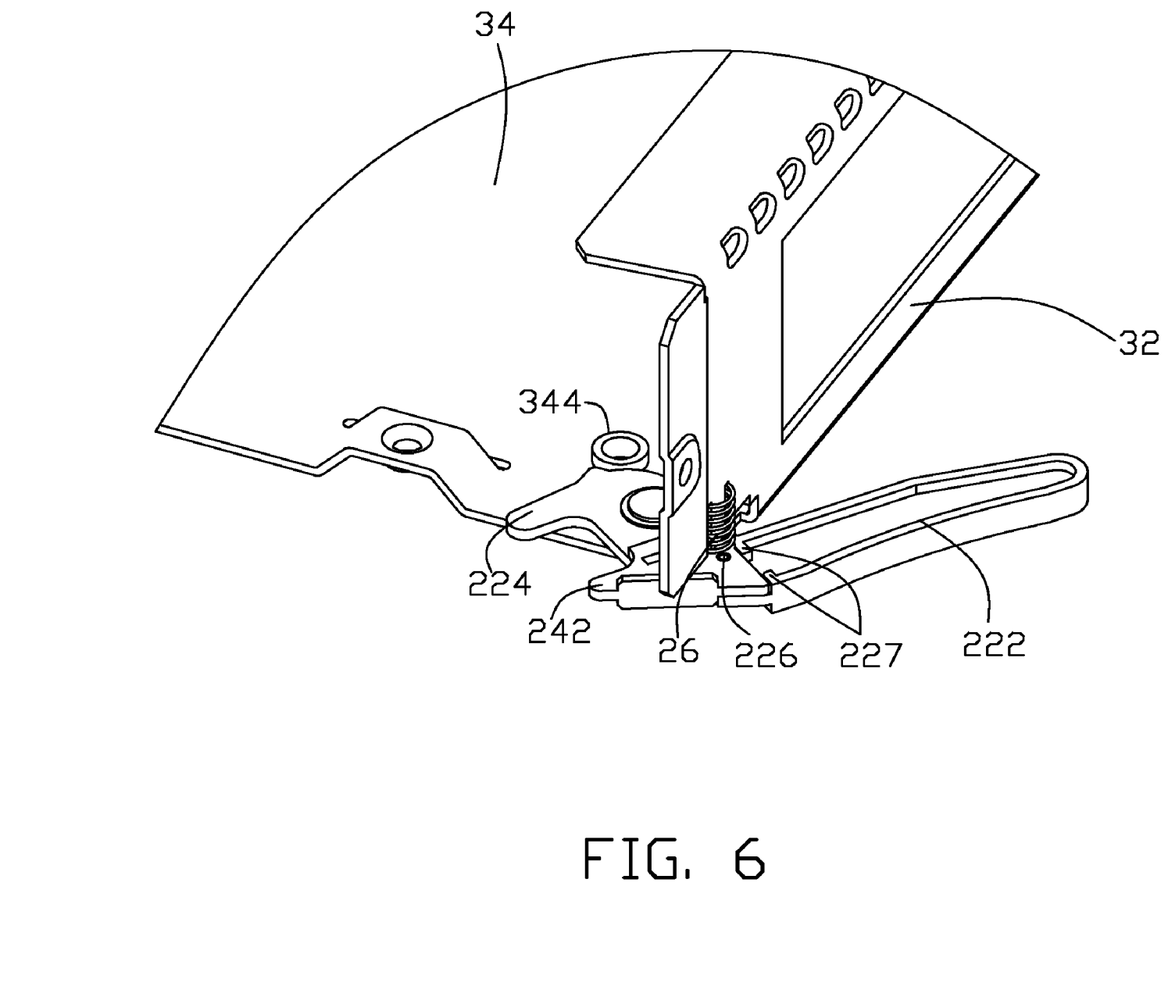
FIG. 6 is another partially assembled perspective view of the removable assembly of FIG. 1, showing a trigger in an open condition.

Also referring to FIG. 3, the panel 32 defines a plurality of ports 322 and a pair of gaps 36. Each of the pair of gaps 36 defines a second opening 361 and is contiguous with the support tray 34. The second openings 361 are respectively towards two opposite sides of the panel 32. In assembly, the support tray 34 is inserted into the shell 10, and the panel 32 shields the first opening 12 of the shell 10. The panel 32 further defines a pair of fixing holes 324 used to match a pair of screws 38 screwed in the shell 10.

Referring to FIG. 3-FIG. 6, the pair of handle assemblies 20 are used to insert or remove the support tray 34 and the panel 32 into or from the shell 10. Each of the pair of handle assemblies 20 comprises a trigger 22, a shiftable plate 24 and a spring 26. The trigger 22 passes through the corresponding gap 36 and is pivoted to the support tray 34. The trigger 22 comprises a hook 224 overlapping the support tray 34 and a handle 222. The hook 224 and the handle 222 are respectively located two sides of the panel 32. During rotation of the handle 222 of the trigger 22, the hook 224 is rotated on the support tray 34 and hooks in and interferes with the corresponding groove 14 to insert the removable assembly 30 into the shell 10. In this embodiment, the trigger 22 is pivoted to the support tray 34 via a rivet 50 passing through a washer 40, a pivoting hole 341 defined in the support tray 34 and a through hole 221 defined in the trigger 22 from one side of the support tray 34 and riveted on the other side of support tray 34.

For limiting rotation of the triggers 22 when the triggers 22 are rotated to an open condition (shown in FIG. 6), the support tray 34 further comprises a pair of stoppers 344 respectively close to the pair of the triggers 22. That is to say, when the triggers 22 are rotated to the open condition, the triggers 22 are stopped when the triggers 22 touch with the stoppers 344. In assembly, each of the stopper 344 and the corresponding groove 14 defined in the shell 10 are respectively located on two opposite sides of the corresponding trigger 22 (shown in FIG. 4).

The shiftable plate 24 is partly received in the corresponding gap 36 and comprises an urging portion 242. The shiftable plate 24 engages with the trigger 22 to rotate together with the trigger 22. The shiftable plate 24 disengages with the trigger 22 under an external force F to keep the support tray 34 immovable during rotating the trigger 22 (shown in FIG. 7). Each of the shiftable plates 24 comprises a positioning edge 244 and defines a positioning hole 246. Each of the triggers 22 comprises at least one positioning wall 227 and a pin 226. The shiftable plates 24 engages with the trigger 22 via the positioning edges 244 urging the positioning wall 227, and the pins 226 positioned in the positioning holes 246. Each of the urging portions 242 and a corresponding hook 224 are respectively located on two opposite sides of the panel 32, and configured to be co-formed as a substantially C-shaped configuration. In assembly, the urging portions 242 face an outer surface 11 of the shell 10 and are used to urge the outer surface 11 to remove the support tray 34 and the panel 32 out from the shell 10.

The spring 26 is urged between the panel 12 and the shiftable plate 24 to ensure the shiftable plate 24 engaging with the trigger 22 after the external force F disappears. In this embodiment, the panel 12 defines two pair of slots 325. Each pair of the slots 325 are corresponding and in communication with one of the gaps 36. A positioning post 326 is formed between each pair of the slots 325 to position the spring 26 of the corresponding handle assembly 20.

In process of inserting support tray 34 into the shell 10, the handle 222 of the trigger 22 is rotated towards the panel 32 to drive the hook 224 to move in and interfere with the corresponding groove 14 until the support tray 34 is inserted into the shell 10.

In process of removing the support tray 34 away from the shell 10, the handles 222 of the triggers 22 are rotated away from the panel 32 to drive the hooks 224 to move out from the grooves 14, simultaneously, the shiftable plates 24 are driven by the handles 222 to urge the outer surface 11 of the shell 10 until the support tray 34 is removed from the shell 10.

Figure 7:
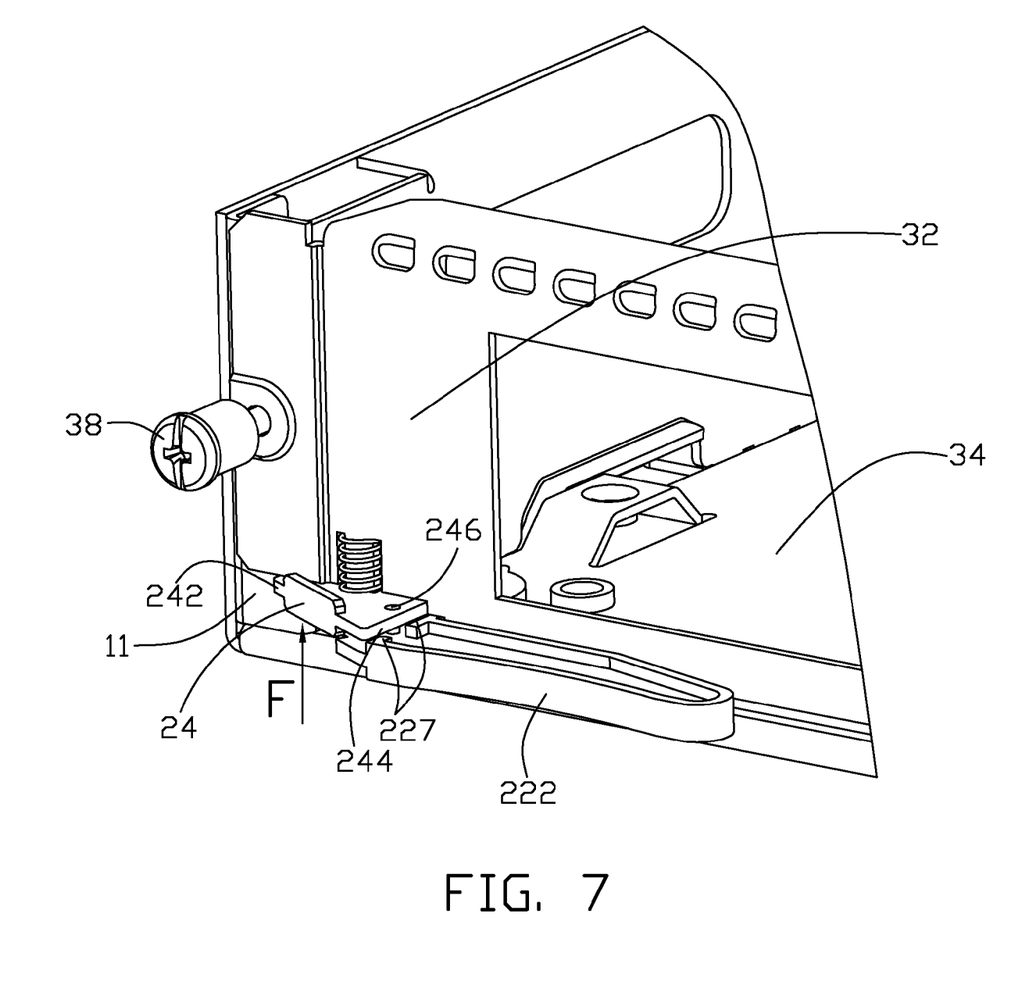
FIG. 7 is a partially assembled perspective view of the removable assembly used in the communication device of FIG. 1, showing a shiftable plate driven by an external force.

Referring to FIG. 7, when the support tray 34 and the panel 32 are inserted into and fix to the shell 10, the handles 222 of the triggers 22 are close to some of the ports 322 defined in the panel 32. When connectors (not labeled), such as RJ45 connectors, are needed to be inserted into or removed from the ports 322 close to the triggers 22, the external force F should be brought to bear on the shiftable plate 24 to push the shiftable plate 24 and release the shiftable plate 24 away from the trigger 22 with the spring 26 compressed, in this condition, the trigger 22 is rotated away from the panel 32 to provide enough space around the ports 322 for commodiousness of inserting or removing the connectors.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A removable assembly adapted to be inserted into a shell defining a pair of grooves in a pair of opposite inner walls of the shell respectively, the removable assembly comprising:
    a support tray;
    a panel perpendicular to the support tray and defining a pair of gaps; and
    a pair of handle assemblies used to insert or remove the support tray into or from the shell, each of the pair of handle assemblies comprising:
    a trigger passing through the corresponding gap of the panel and pivoted to the support tray, the trigger used to match with the corresponding groove to insert the support tray and the panel into the shell;
    a shiftable plate partly received in the corresponding gap to engage with the trigger to rotate together with the trigger or disengage from the trigger under an external force to keep the support tray immovable during rotating the trigger, the shiftable plate comprising an urging portion used to urge an outer surface of the shell to move the support tray out from the shell; and
    a spring urged between the panel and the shiftable plate to ensure the shiftable plate engaging with the trigger.

2. The removable assembly as claimed in claim 1, wherein the panel defines two pair of slots, each pair of the slots corresponding and in communication with one of the gaps, and a positioning post is formed between each pair of the slots to position the spring of the corresponding handle assembly.

3. The removable assembly as claimed in claim 2, wherein each of the shiftable plates comprises a positioning edge and defines a positioning hole, and each of the triggers comprises at least one positioning wall and a pin, wherein the shiftable plates engage with the trigger by the positioning edges matching the positioning wall and the pins positioned in the positioning holes.

4. The removable assembly as claimed in claim 3, wherein each of the triggers comprises a hook overlapping the support tray and a handle, the hook and the handle respectively located two sides of the panel, wherein the hook is used to match with the corresponding groove to insert the support tray and the panel into the shell.

5. The removable assembly as claimed in claim 4, wherein the pair of gaps are respectively contiguous with the support tray, and each of the pair of gaps defines a second opening respectively towards two opposite sides of the panel.

6. The removable assembly as claimed in claim 5, wherein the panel comprises a plurality of ports, when the support tray and the panel are inserted into the shell, the handles of the triggers shelter some of the ports.

7. The removable assembly as claimed in claim 6, wherein the panel defines a pair of fixing holes to match a pair of screws screwed in the shell.

8. The removable assembly as claimed in claim 7, wherein the support tray comprises a pair of stopper to limit rotation of the trigger when the trigger is rotated to an open condition.

9. A communication device, comprising:
    a shell, defining a pair of grooves in a pair of opposite inner walls of the shell respectively; and
    a removable assembly, comprising:
        a support tray;
        a panel perpendicular to the support tray and defining a pair of gaps; and
        a pair of handle assemblies used to insert or remove the support tray into or from the shell, each of the pair of handle assemblies comprising:
        a trigger passing through the corresponding gap of the panel and pivoted to the support tray, the trigger used to match with the corresponding groove to insert the support tray and the panel into the shell;
        a shiftable plate partly received in the corresponding gap to engage with the trigger to rotate together with the trigger or disengage from the trigger under an external force to keep the support tray immovable during rotating the trigger, the shiftable plate comprising an urging portion used to urge an outer surface of the shell to move the support tray out from the shell; and
        a spring urged between the panel and the shiftable plate to ensure the shiftable plate engaging with the trigger.

10. The communication device as claimed in claim 9, wherein the panel defines two pair of slots, each pair of the slots corresponding and in communication with one of the gaps, and a positioning post is formed between each pair of the slots to position the spring of the corresponding handle assembly.

11. The communication device as claimed in claim 10, wherein each of the shiftable plates comprises a positioning edge and defines a positioning hole, and each of the triggers comprises at least one positioning wall and a pin, wherein the shiftable plates engage with the trigger by the positioning edges matching the positioning wall and the pins positioned in the positioning holes.

12. The communication device as claimed in claim 11, wherein each of the triggers comprises a hook overlapping the support tray and a handle, the hook and the handle respectively located two sides of the panel, wherein the hook is used to match with the corresponding groove to insert the support tray and the panel into the shell.

13. The communication device as claimed in claim 12, wherein the pair of gaps are respectively contiguous with the support tray, and each of the pair of gaps defines a second opening respectively towards two opposite sides of the panel.

14. The communication device as claimed in claim 13, wherein the panel comprises a plurality of ports, when the support tray and the panel are inserted into the shell, the handles of the triggers shelter some of the ports.

15. The communication device as claimed in claim 14, wherein the panel defines a pair of fixing holes to match a pair of screws screwed in the shell.

16. The communication device as claimed in claim 15, wherein the support tray comprises a pair of stopper to limit rotation of the trigger when the trigger is rotated to an open condition.

* * * * *